(12) United States Patent
Liu

(10) Patent No.: US 10,771,078 B2
(45) Date of Patent: Sep. 8, 2020

(54) COMPARATOR OFFSET CALIBRATION SYSTEM AND ANALOG-TO-DIGITAL CONVERTER WITH COMPARATOR OFFSET CALIBRATION

(71) Applicant: MEDIATEK INC., Hsin-Chu (TW)

(72) Inventor: Chun-Cheng Liu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/378,759

(22) Filed: Apr. 9, 2019

(65) Prior Publication Data

US 2019/0356326 A1 Nov. 21, 2019

Related U.S. Application Data

(60) Provisional application No. 62/671,495, filed on May 15, 2018.

(51) Int. Cl.

| | | |
|---|---|---|
| *H03M 1/10* | (2006.01) | |
| *H03M 1/34* | (2006.01) | |
| *H03H 19/00* | (2006.01) | |
| *H03M 1/06* | (2006.01) | |
| *H03M 1/12* | (2006.01) | |
| *H03M 3/00* | (2006.01) | |

(52) U.S. Cl.
CPC ........ *H03M 1/1023* (2013.01); *H03H 19/004* (2013.01); *H03M 1/0607* (2013.01); *H03M 1/121* (2013.01); *H03M 1/34* (2013.01); *H03M 1/1009* (2013.01); *H03M 3/38* (2013.01)

(58) Field of Classification Search
CPC .... H03M 1/1009; H03M 1/1023; H03M 3/38; H03M 1/34; H03M 1/0607; H03M 1/121; H03H 19/004

USPC ................................. 341/120, 118, 155, 172
See application file for complete search history.

(56) References Cited

U.S. PATENT DOCUMENTS

| | | | |
|---|---|---|---|
| 5,495,200 A | 2/1996 | Kwan et al. | |
| 6,538,594 B1 * | 3/2003 | Somayajula | H03M 1/1023 341/120 |
| 7,146,283 B2 * | 12/2006 | Daigle | H03M 1/1028 702/107 |

(Continued)

OTHER PUBLICATIONS

Kull, L., et al.; "A 10b 1.5GS/s Pipelined-SAR ADC with Background Second-Stage Common-Mode Regulation and Offset Calibration in 14nm CMOS FinFET;" IEEE International Solid-State Circuits Conference; Session 28; 2017; pp. 174-476.

(Continued)

*Primary Examiner* — Joseph J Lauture
(74) *Attorney, Agent, or Firm* — McClure, Qualey & Rodack, LLP

(57) ABSTRACT

A comparator offset calibration system having a comparator offset evaluator and a switched-capacitor network is disclosed, which is in an analog and digital dual domain structure. The comparator offset evaluator receives digital data from an analog-to-digital conversion module, evaluates an offset of a comparator of the analog-to-digital conversion module based on the received digital data, and outputs an evaluated result. The switched-capacitor network processes the evaluated result to generate a control signal. The analog-to-digital conversion module adjusts the offset of the comparator according to the control signal.

15 Claims, 3 Drawing Sheets

(56) References Cited

U.S. PATENT DOCUMENTS 9,843,337 B1 * 12/2017 Li ........................ H03M 1/0673

OTHER PUBLICATIONS

Van der Plas, G., et al.; "A 0.16pJ/Conversion-Step 2.5mW 1.25GS/s 4b ADC in a 90nm Digital CMOS Process;" IEEE International Solid-State Circuits Conference; Session 31; 2006; pp. 1-10.

Miyahara, M., et al.; "A Low-Noise Self-Calibrating Dynamic Comparator for High-Speed ADCs;" IEEE Asian Solid-State Circuits Conference; Nov. 2008; pp. 269-272.

Alpman, E., et al.; "A 1.1V 50mW 2.5GS/s 7b Time-Interleaved C-2C SAR ADC in 45nm LP Digital CMOS;" IEEE International Solid-State Circuits Conference; Session 4; 2009; pp. 75-77.

* cited by examiner

COMPARATOR OFFSET CALIBRATION SYSTEM AND ANALOG-TO-DIGITAL CONVERTER WITH COMPARATOR OFFSET CALIBRATION

CROSS REFERENCE TO RELATED APPLICATIONS

This application claims the benefit of U.S. Provisional Application No. 62/671,495, filed May 15, 2018, the entirety of which is incorporated by reference herein.

BACKGROUND OF THE INVENTION

Field of the Invention

The present invention relates to comparator offset calibration.

Description of the Related Art

With the reduction of transistor dimensions, amplifiers are becoming more difficult to design. There is an increasing interest in circuit design to use comparators rather than amplifiers.

For example, in the field of analog-to-digital conversion, successive approximation register (SAR) and flash topologies are commonly used today, which use comparators to form the essential building block. The effective resolution of an analog-to-digital converter (ADC) may be considerably affected by offset due to comparator mismatch.

Flash ADC is a quantization process achieved by comparing an input signal with all transition points between adjacent quantization levels simultaneously. The comparators operate in parallel and the conversion result should be generated in one clock period. A SAR ADC is implemented by a charge-redistribution technique. In the different steps of charge-redistribution, a residual signal is fed to a comparator and digital representation of the analog input is obtained from the sequential compared results. Comparators with high accuracy are called for in ADC design.

In additional to ADCs, there are various circuits use comparators. Calibration techniques for comparator offset are called for.

BRIEF SUMMARY OF THE INVENTION

A comparator offset calibration system in a dual domain structure is introduced.

A comparator offset calibration system in accordance with an exemplary embodiment of the disclosure has a comparator offset evaluator and a switched-capacitor network. The comparator offset evaluator receives digital data from an analog-to-digital conversion module, evaluates an offset of a comparator of the analog-to-digital conversion module based on the received digital data, and outputs an evaluated result. The switched-capacitor network processes the evaluated result to generate a control signal. The analog-to-digital conversion module adjusts the offset of the comparator according to the control signal.

The comparator offset evaluator may output the evaluated result in a pulse width modulation form.

The comparator offset evaluator may evaluate the offset of the comparator by long-term judgment of the received digital data.

The comparator offset evaluator may use an accumulation module to transform a series of judgment values obtained by the long-term judgment to the evaluated result that is in the pulse width modulation form. The evaluated result in the pulse width modulation form is retrieved from a carry-out output of the accumulation module.

The comparator offset evaluator may repeat mean value calculation on the received digital data periodically to generate a series of mean values and perform mean-value judgment on the series of mean values. The comparator offset evaluator may perform the mean value judgment by comparing the series of mean values with a reference value and thereby generates the series of judgment values. The digital data may be N bits, where N is a number. The reference value may be $(2^N-1)/2$.

The comparator offset calibration system may further have a calibration circuit provided within the analog-to-digital conversion module. The comparator of the analog-to-digital conversion module may have an input pair. The calibration circuit may be an auxiliary input pair for the comparator. The auxiliary input pair may receive the control signal. In this example, the control signal is in a differential form. The switched-capacitor network may use a first switched-capacitor filter and a second switched-capacitor filter to generate the control signal that is in the differential form. The comparator offset evaluator may obtain a first series of judgment values and a second series of judgment values by the long-term judgment. The comparator offset evaluator may use a first accumulator to accumulate the first series of judgment values and use a second accumulator to accumulate the second series of judgment values. The carry out bit of the first accumulator may be coupled to the first switched-capacitor filter and the carry out bit of the second accumulator may be coupled to the second switched-capacitor filter. The comparator offset evaluator may repeat mean value calculation on the received digital data periodically to generate a series of mean values and perform mean value judgment on the series of mean values. The comparator offset evaluator may perform the mean value judgment by comparing the series of mean values with a reference value and thereby generate the first series of judgment values and the second series of judgment values. The digital data may be N bits, where N is a number. The reference value may be $(2^N-1)/2$.

The first switched-capacitor filter and the second switched-capacitor filter may be multi-stage filters.

The first accumulator and the second accumulator may operate according to a first clock. The first switched-capacitor filter and the second switched-capacitor filter may operate according to the first clock and a second clock. The second clock may be limited to having non-overlapped activation intervals with the first clock.

The comparator offset evaluator may down-sample the received digital data to ease the long-term judgment.

In some exemplary embodiments, devices using a comparator and calibrating the comparator based on the aforementioned design are also presented in the disclosure.

In an exemplary embodiment, an analog-to-digital converter in shown, which has an analog-to-digital conversion module, a comparator offset evaluator, and a switched-capacitor network. The analog-to-digital conversion module has at least one comparator. The comparator offset evaluator receives digital data from the analog-to-digital conversion module, evaluates an offset of the at least one comparator based on the received digital data, and outputs evaluated result. The switched-capacitor network processes the evaluated result to generate a control signal. The analog-to-digital conversion module adjusts the offset of the comparator according to the control signal. In an exemplary embodiment, the analog-to-digital conversion module has a first comparator and a second comparator. The first comparator and the second comparator share the comparator offset evaluator and the switched-capacitor network.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

A comparator offset calibration system in a dual domain (analog domain and digital domain both) structure is introduced in the disclosure. The comparator offset calibration system may be adopted in any electronic device using a comparator.

Figure 1:
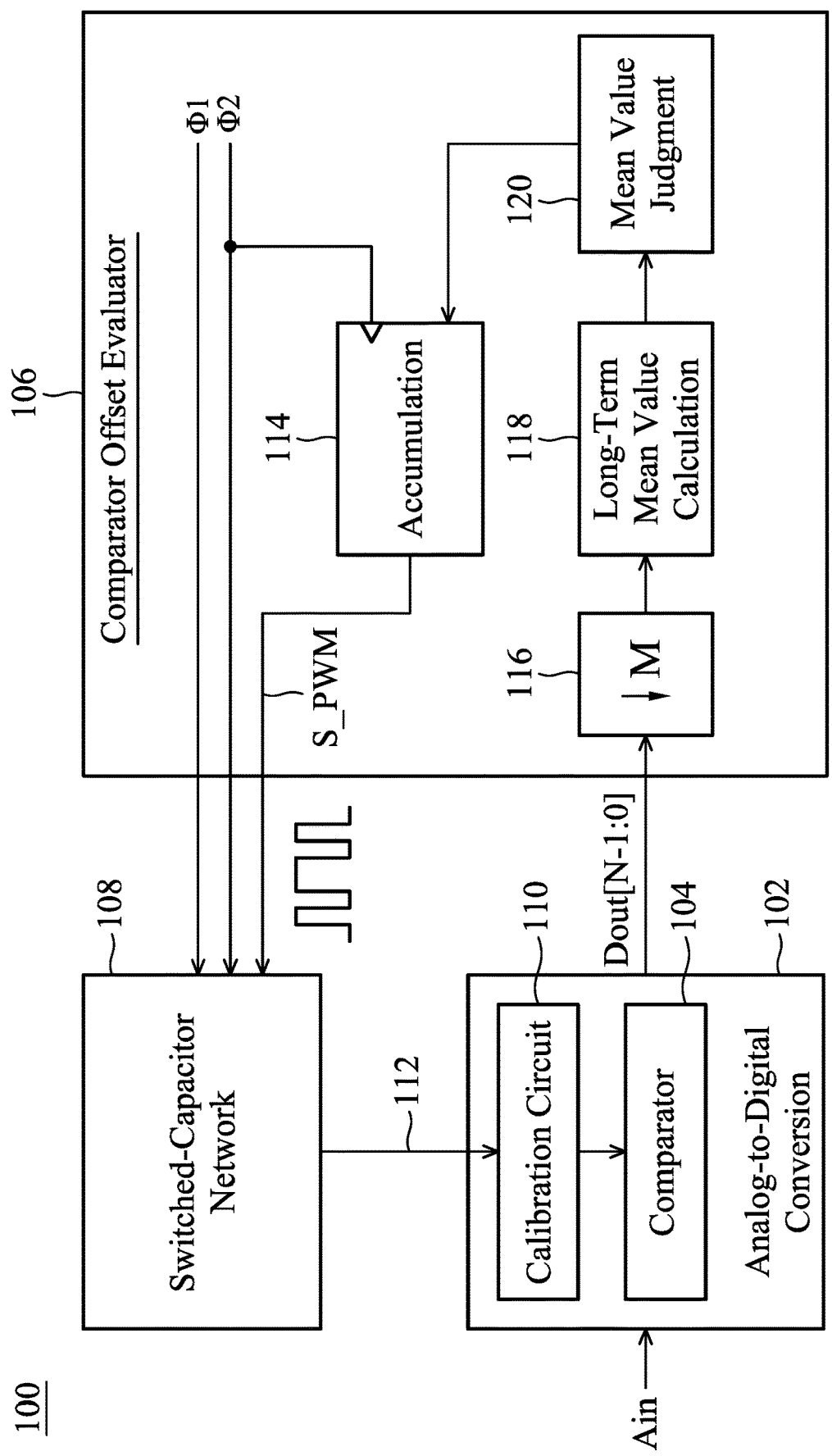
FIG. 1 depicts an analog-to-digital converter (ADC) 100 adopting a comparator offset calibration system in accordance with an exemplary embodiment of the disclosure.

FIG. 1 depicts an analog-to-digital converter (ADC) 100 adopting a comparator offset calibration system in accordance with an exemplary embodiment of the disclosure. In an analog-to-digital conversion module 102 for analog-to-digital conversion (e.g. for flash ADC or successive approximation register (SAR) ADC) that converts an analog input Ain to a digital output Dout[N−1:0], at least one comparator 104 is required. To calibrate an offset of the comparator 104, a comparator offset evaluator 106, a switched-capacitor network 108 and a calibration circuit 110 are provided to form a comparator offset calibration system.

The digital output Dout[N−1:0] generated by the analog-to-digital conversion module 102 is collected as digital data to be received by the comparator offset evaluator 106. The comparator offset evaluator 106 performs sigma-delta modulation (SDM) which evaluates the offset of the comparator 104 based on the received digital data Dout[N−1:0] and outputs evaluated result S_PWM in a pulse width modulation (PWM) form. The switched-capacitor network 108 processes the evaluated result S_PWM to generate a control signal 112. The calibration circuit 110 calibrates the offset of the comparator 104 based on the control signal 112.

In one embodiment of the present disclosure, the comparator offset evaluator 106 receiving the digital data Dout[N−1:0] and outputting a PWM signal (S_PWM) can be implemented by using digital circuits, whereas the switched-capacitor network 108 and the calibration circuit 110 can be implemented by using analog circuits.

In the embodiment, the noise of the comparator 104 is effectively suppressed by the comparator offset evaluator 106 in digital domain, the dual domain structure does not require using additional cycles for connecting (short circuit) the comparator inputs for determining the offset value as some conventional analog-domain calibration techniques do. The offset value can be evaluated by the comparator offset evaluator 106 in digital domain.

The comparator offset evaluator 106 evaluates the offset of the comparator 104 by long-term judgment of the received digital data Dout[N−1:0]. During the long-term judgment, the analog-to-digital conversion module 102 may normally operate without being interrupted to do offset determination of the comparator 104.

The comparator offset evaluator 106 may use an accumulation module 114 to transform a series of judgment values obtained by the long-term judgment to the PWM signal S_PWM. The PWM signal S_PWM is retrieved from a carry-out output of the accumulation module 114.

In FIG. 1, the long-term judgment is implemented by a down-sampling module 116, a module 118 for long-term mean value calculation, and a module 120 for mean value judgment. The down-sampling module 116 down-samples the digital data Dout[N−1:0] to ease the long-term judgment. By operating the modules 118 and 120, mean value calculation is repeated periodically to generate a series of mean values and mean value judgment is performed on the series of mean values. The module 120 may perform the mean value judgment by comparing the series of mean values with a reference value and thereby generates the series of judgment values to be accumulated by the accumulation module 114. As shown, the digital data Dout[N−1:0] is N bits, and the reference value may be the ideal mean output of the N-bit ADC, $(2^N-1)/2$.

In some conventional techniques, the digital data Dout[N−1:0] is evaluated in the digital domain and the evaluated result is directly used in the modification of the digital data Dout[N−1:0]. For high precision requirements, high cost digital processor is required. In the disclosure, however, the compensation accuracy depends on the switched-capacitor network 108 and the calibration circuit 110. The comparator offset evaluator 106 only needs to roughly show the degree of offset. The high-accuracy compensation is achieved by the switched-capacitor network 108 and the calibration circuit 110.

Figure 2:
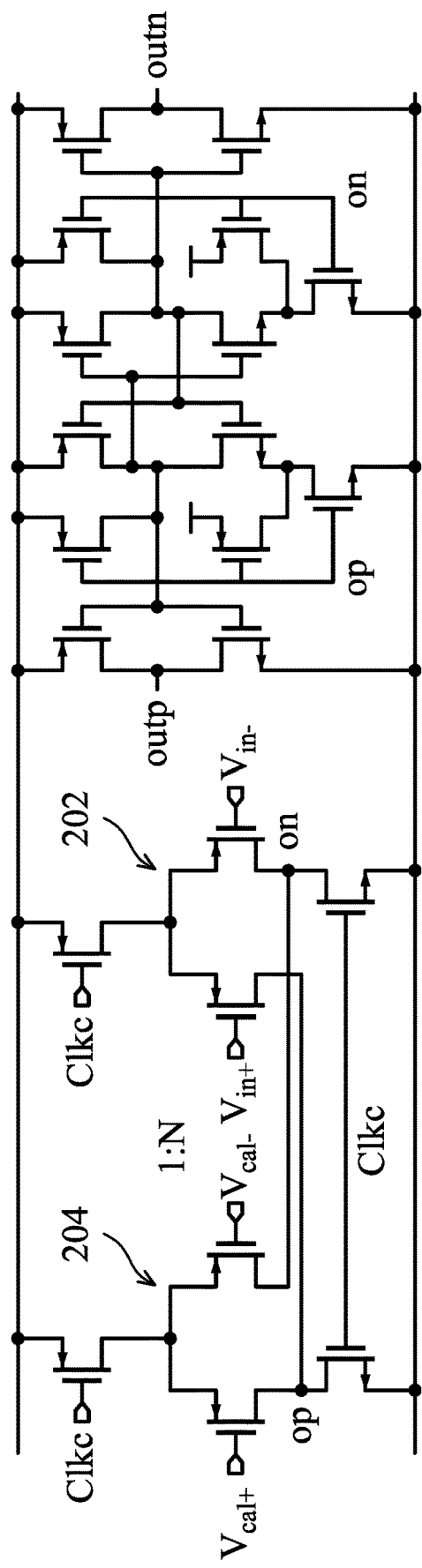
FIG. 2 depicts the circuit details of the comparator 104 and the calibration circuit 110 in accordance with an exemplary embodiment of the disclosure.

FIG. 2 depicts the circuit details of the comparator 104 and the calibration circuit 110 in accordance with an exemplary embodiment of the disclosure. The comparator has an input pair 202. The calibration circuit 110 is implemented as an auxiliary input pair 204 provided for the comparator. The control signal 112 received by the calibration circuit 110 is implemented in a differential form as including signals Vcal+ and Vcal− which are fed to the auxiliary input pair 204. The transistor size ratio between the auxiliary input pair 204 and the input pair 202 is 1:N, which determines the compensation precision.

Figure 3:
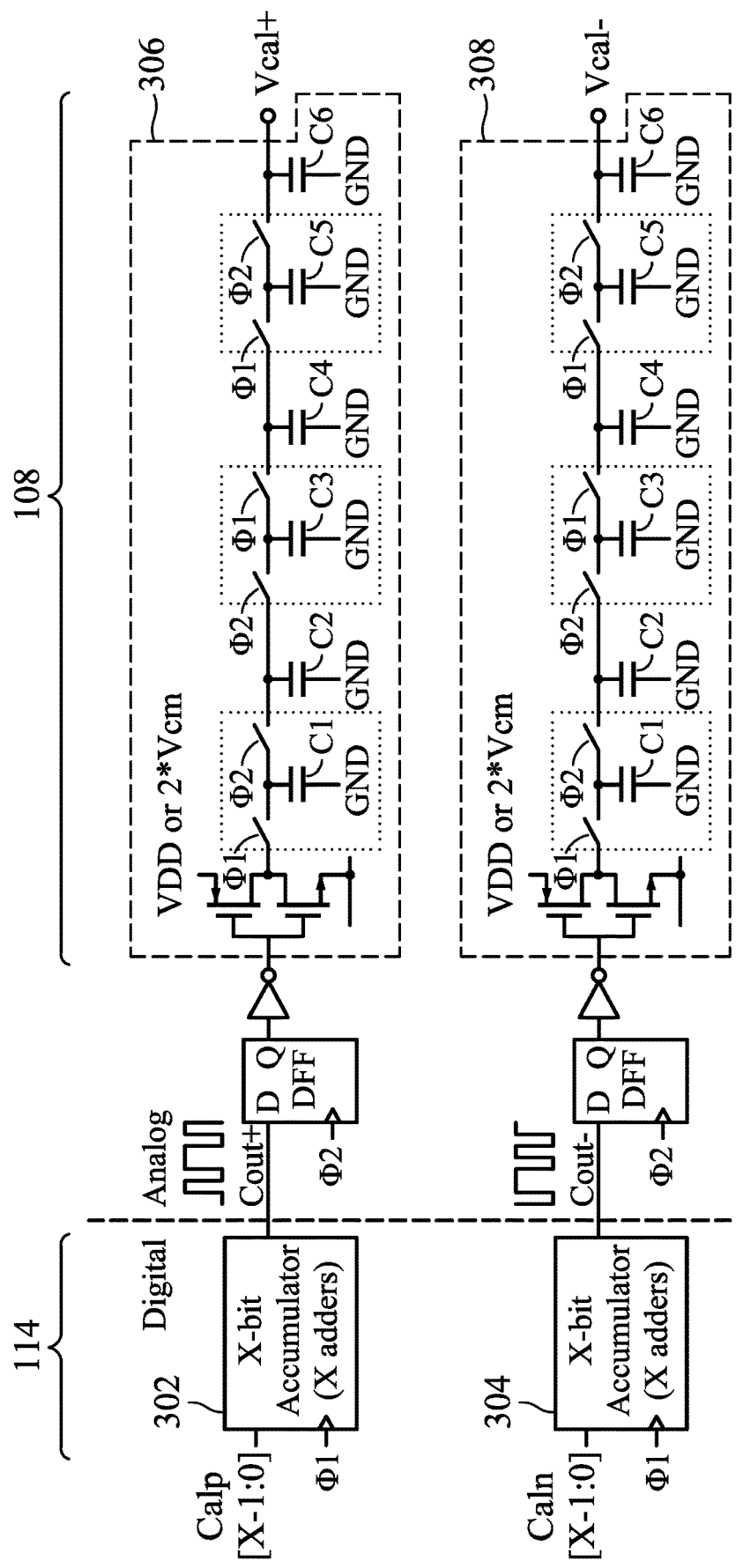
FIG. 3 depicts the details of the accumulation module 114 and the switched-capacitor network 108 in accordance with an exemplary embodiment of the disclosure.

As for the generation of the positive control signal Vcal+ and the negative control signal Vcal− fed to the auxiliary input pair 204, FIG. 3 depicts the details of the switched-capacitor network 108 and the accumulation module 114 in accordance with an exemplary embodiment of the disclosure. A first accumulator 302 and a second accumulator 304 are provided to form the accumulation module 114. The switched-capacitor network 108 comprises a first switched-capacitor filter 306 and a second switched-capacitor filter 308.

The modules 116, 118 and 120 for long-term judgment of the digital data Dout[N−1:0] generate judgment values Calp[X−1: 0] and Caln[X−1: 0] for generation of the positive and negative control signals Vcal+, and Vcal−, respectively. The X-bit judgment value Calp[X−1: 0] and the X-bit judgment value Calnp[X−1: 0] show the degree of comparator offset in a differential form. The X-bit judgment value Calp[X−1: 0] generated at different time points are accumulated by the first accumulator 302. A pulse width modulation signal Cout+, therefore, is generated at a carry-out bit of the first accumulator 302 and is coupled to the first switched-capacitor filter 306 to be filtered to the positive control signal Vcal+. The X-bit judgment value Caln[X−1: 0] generated at different time points are accumulated by the second accumulator 304. A pulse width modulation signal Cout−, therefore, is generated at a carry-out bit of the second accumulator 304 and is coupled to the second switched-capacitor filter 308 to be filtered to the negative control signal Vcal−. The positive control signal Vcal+ and the negative control signal Vcal− are fed to the positive input terminal and the negative input terminal of the auxiliary input pair 204, respectively. In an exemplary embodiment, the first switched-capacitor filter 306 and the second switched-capacitor filter 308 are multi-stage filters. The pulse width signals Cout+ and Cout− are filtered to DC levels Vcal+ and Vcal−.

As shown, the clocks used in the digital domain may be shared to the switched-capacitor network 108. The first accumulator 302 and the second accumulator 304 operate according to a first clock Φ1. The first clock Φ1 is fed to the first switched-capacitor filter 306 and the second switched-capacitor filter 308 with a second clock Φ2 for switch control. The second clock Φ2 has non-overlapped activation intervals with the first clock Φ1.

In some exemplary embodiments, the comparator offset calibration system of the disclosure may be shared by several comparators for offset calibration. In an exemplary embodiment, a flash ADC includes several comparators operate the comparator offset calibration system in an interleaving way to calibrate the different comparators.

The comparator offset calibration system of the disclosure also considerably improves the accuracy of SAR ADCs.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A comparator offset calibration system, comprising:
a comparator offset evaluator, receiving digital data from an analog-to-digital conversion module which comprises a comparator, evaluating an offset of the comparator based on the received digital data, and outputting an evaluated result; and
a switched-capacitor network, processing the evaluated result to generate a control signal,
wherein:
the comparator offset evaluator outputs the evaluated result in a pulse width modulation form;
the comparator offset evaluator evaluates the offset of the comparator by long-term judgment of the received digital data; and
the analog-to-digital conversion module adjusts the offset of the comparator according to the control signal.

2. The comparator offset calibration system as claimed in claim 1, wherein:

the comparator offset evaluator uses an accumulation module to transform a series of judgment values obtained by the long-term judgment to the evaluated result that is in the pulse width modulation form; and
the evaluated result in the pulse width modulation form is retrieved from a carry-out output of the accumulation module.

3. The comparator offset calibration system as claimed in claim 2, wherein:
the comparator offset evaluator repeats mean value calculation on the received digital data periodically to generate a series of mean values and performs mean value judgment on the series of mean values.

4. The comparator offset calibration system as claimed in claim 3, wherein:
the comparator offset evaluator performs the mean value judgment by comparing the series of mean values with a reference value and thereby generates the series of judgment values.

5. The comparator offset calibration system as claimed in claim 4, wherein:
the digital data is N bits, where N is a number; and
the reference value is $(2^N-1)/2$.

6. The comparator offset calibration system as claimed in claim 1, further comprising:
a calibration circuit provided within the analog-to-digital conversion module,
wherein:
the comparator has an input pair;
the calibration circuit is an auxiliary input pair provided for the comparator, and the auxiliary input pair receives the control signal; and
the control signal is in a differential form.

7. The comparator offset calibration system as claimed in claim 6, wherein:
the switched-capacitor network uses a first switched-capacitor filter and a second switched-capacitor filter to generate the control signal that is in the differential form.

8. The comparator offset calibration system as claimed in claim 7, wherein:
the comparator offset evaluator obtains a first series of judgment values and a second series of judgment values by the long-term judgment;
the comparator offset evaluator uses a first accumulator to accumulate the first series of judgment values and uses a second accumulator to accumulate the second series of judgment values; and
a first carry out bit of the first accumulator is coupled to the first switched-capacitor filter and a second carry out bit of the second accumulator is coupled to the second switched-capacitor filter.

9. The comparator offset calibration system as claimed in claim 8, wherein:
the comparator offset evaluator repeats mean value calculation on the received digital data periodically to generate a series of mean values and performs mean value judgment on the series of mean values.

10. The comparator offset calibration system as claimed in claim 9, wherein:
the comparator offset evaluator performs the mean value judgment by comparing the series of mean values with a reference value and thereby generates the first series of judgment values and the second series of judgment values.

11. The comparator offset calibration system as claimed in claim 10, wherein:

the digital data is N bits, where N is a number; and
the reference value is $(2^N-1)/2$.

12. The comparator offset calibration system as claimed in claim 8, wherein:
the first accumulator and the second accumulator operate according to a first clock;
the first switched-capacitor filter and the second switched-capacitor filter operate according to the first clock and a second clock; and
the second clock has non-overlapped activation intervals with the first clock.

13. The comparator offset calibration system as claimed in claim 7, wherein:
the first switched-capacitor filter and the second switched-capacitor filter are multi-stage filters.

14. The comparator offset calibration system as claimed in claim 1, wherein:
the comparator offset evaluator down-samples the received digital data to ease the long-term judgment.

15. An analog-to-digital converter, comprising:
an analog-to-digital conversion module, comprising at least one comparator;
a comparator offset evaluator, receiving digital data from the analog-to-digital conversion module, evaluating an offset of the at least one comparator based on the received digital data, and outputting evaluated result; and
a switched-capacitor network, processing the evaluated result to generate a control signal,
wherein:
the analog-to-digital conversion module adjusts the offset of the comparator according to the control signal,
the analog-to-digital conversion module comprises a first comparator and a second comparator; and
the first comparator and the second comparator share the comparator offset evaluator and the switched-capacitor network.

* * * * *